US008173035B2

(12) United States Patent
Lin et al.

(10) Patent No.: US 8,173,035 B2
(45) Date of Patent: May 8, 2012

(54) SURFACE TEXTURIZATION METHOD

(75) Inventors: Ching-Hsi Lin, Hsinchu (TW);
Chen-Hsun Du, Taipei (TW);
Chung-Wen Lan, Taipei County (TW)

(73) Assignee: Industrial Technology Research Institute, Hsinchu (TW)

( * ) Notice: Subject to any disclaimer, the term of this patent is extended or adjusted under 35 U.S.C. 154(b) by 600 days.

(21) Appl. No.: 12/371,634

(22) Filed: Feb. 16, 2009

(65) Prior Publication Data

US 2010/0147798 A1 Jun. 17, 2010

(30) Foreign Application Priority Data

Dec. 17, 2008 (TW) .............................. 97149290 A

(51) Int. Cl.
*B44C 1/22* (2006.01)
(52) U.S. Cl. ............... 216/41; 216/24; 216/55; 216/58; 216/83; 438/694; 427/372.2; 323/906
(58) Field of Classification Search ............... 323/906
See application file for complete search history.

(56) References Cited

U.S. PATENT DOCUMENTS

| 5,665,175 A * | 9/1997 | Safir ............................. 136/255 |
| 6,790,785 B1 | 9/2004 | Li et al. |
| 6,926,953 B2 | 8/2005 | Nealey et al. |
| 7,090,784 B2 | 8/2006 | Asakawa et al. |
| 7,135,414 B2 | 11/2006 | Matsumura et al. |
| 2005/0226138 A1 * | 10/2005 | Yamasaki et al. ........... 369/275.5 |
| 2007/0151944 A1 * | 7/2007 | Du .................................. 216/24 |
| 2008/0118867 A1 * | 5/2008 | Sato et al. ................... 430/286.1 |
| 2008/0230514 A1 * | 9/2008 | Park et al. ......................... 216/41 |
| 2008/0247981 A1 * | 10/2008 | Imai et al. .................... 424/70.15 |

FOREIGN PATENT DOCUMENTS

WO 2007025536 3/2007

OTHER PUBLICATIONS

Lin et.al., Phys. Status Solidi C7, No. 11-12 (2010), pp. 2778-2784.*
R.A. Segalman, "Patterning with block copolymer thin films," Materials Science and Engineering R 48 (2005) pp. 191-226.
I W Hamley, "Nanostructure fabrication using block copolymers," Institute of Physics Publishing Nanotechnology 14 (2003) R39-R54.
R.B. Stephens et al., "Optical Reflectance and Transmission of a Textured Surface," Thin Solid Films, 45 (1977) pp. 19-29.
Hitoshi Sai et al., "Light Trapping Effect of Submicron Surface Textures in Crystalline Si Solar Cells," Progress in Photovoltaics: Research and Applications, Prog. Photovolt. Res. Appl. 2007; 15:415-423.

* cited by examiner

*Primary Examiner* — Lan Vinh
*Assistant Examiner* — Jiong-Ping Lu
(74) *Attorney, Agent, or Firm* — Jianq Chyun IP Office

(57) ABSTRACT

A surface texturization method is provided. First, a polymer film is formed on a substrate. Thereafter, a heating treatment is performed on the substrate. The heating treatment results in a textured polymer film having island-shaped and/or micro-crack-shaped patterns. Afterwards, an etching process is performed using the textured polymer film as a mask, so as to remove a portion of the substrate to form a textured structure on the surface of the substrate.

16 Claims, 3 Drawing Sheets

SURFACE TEXTURIZATION METHOD

CROSS-REFERENCE TO RELATED APPLICATION

This application claims the priority benefit of Taiwan application serial no. 97149290, filed on Dec. 17, 2008. The entirety of the above-mentioned patent application is hereby incorporated by reference herein and made a part of specification.

BACKGROUND OF THE INVENTION

1. Field of Invention

The present invention relates to a surface texturization method.

2. Description of Related Art

Solar energy is a very promising clean energy. A solar cell which can directly convert solar light into electricity has been the focus recently. One of the major requirements for obtaining a high-efficiency solar cell is to enhance the absorption of solar light. All high-efficiency crystalline silicon solar cells up to date are textured on the front surface to reduce the reflection losses and to improve the light-trapping properties.

In the light-absorption mechanism, with a multi-crystalline silicon solar cell as an example, the conventional process includes performing a wet etching process to macro-texturize the surface to a micron scale and then depositing an anti-reflection coating for enhancing the absorption rate of solar light. However, the average reflectivity of such micron-scale textured structure is usually more than 10% in the wavelength range from 300 nm to 900 nm, i.e. the spectra region of strong Si absorption.

Currently, when the surface textured structure has a dimension close to the wavelength of incident solar light (i.e. the surface is a nano-scale textured structure), it has been proved to be quite efficient in capturing the incident light having a wavelength less than 1.1 um. However, the method of forming such nano-scale surface textured structure requires performing a more expensive and time-consuming vacuum sputtering, a complicated electroless plating metal deposition or a copolymerization reaction, so as to form a heavy burden in the fabrication cost.

Accordingly, how to fabricate a nano-scale surface textured structure quickly at low cost so as to effectively enhance the efficiency of the solar cell has become one of the main topics in the industry.

SUMMARY OF THE INVENTION

The present invention provides a quick and low-cost surface texturization method, so that the reflectivity of the fabricated textured structure in a broad spectrum range can be effectively reduced.

The present invention provides a surface texturization method. First, a polymer film is formed on a substrate. Thereafter, a heating treatment is performed to the substrate, so as to form a textured polymer film having island-shaped and/or microcrack-shaped patterns. Afterwards, an etching process is performed using the textured polymer film as a mask, so as to remove a portion of the substrate to form a textured structure on the surface of the substrate.

In summary, the surface texturization method of the present invention only requires a simple coating process, a heating treatment and an etching process to complete a nano-scale surface textured structure. Further, the surface texturization method of the present invention does not require the conventional expensive vacuum sputtering, the complicated electroless plating process or the time-consuming copolymerization reaction; that is, the process is flexible so that the cost is greatly saved and the competitiveness is significantly improved.

In order to make the aforementioned and other objects, features and advantages of the present invention comprehensible, a preferred embodiment accompanied with figures is described in detail below.

DESCRIPTION OF EMBODIMENTS

Figure 1:
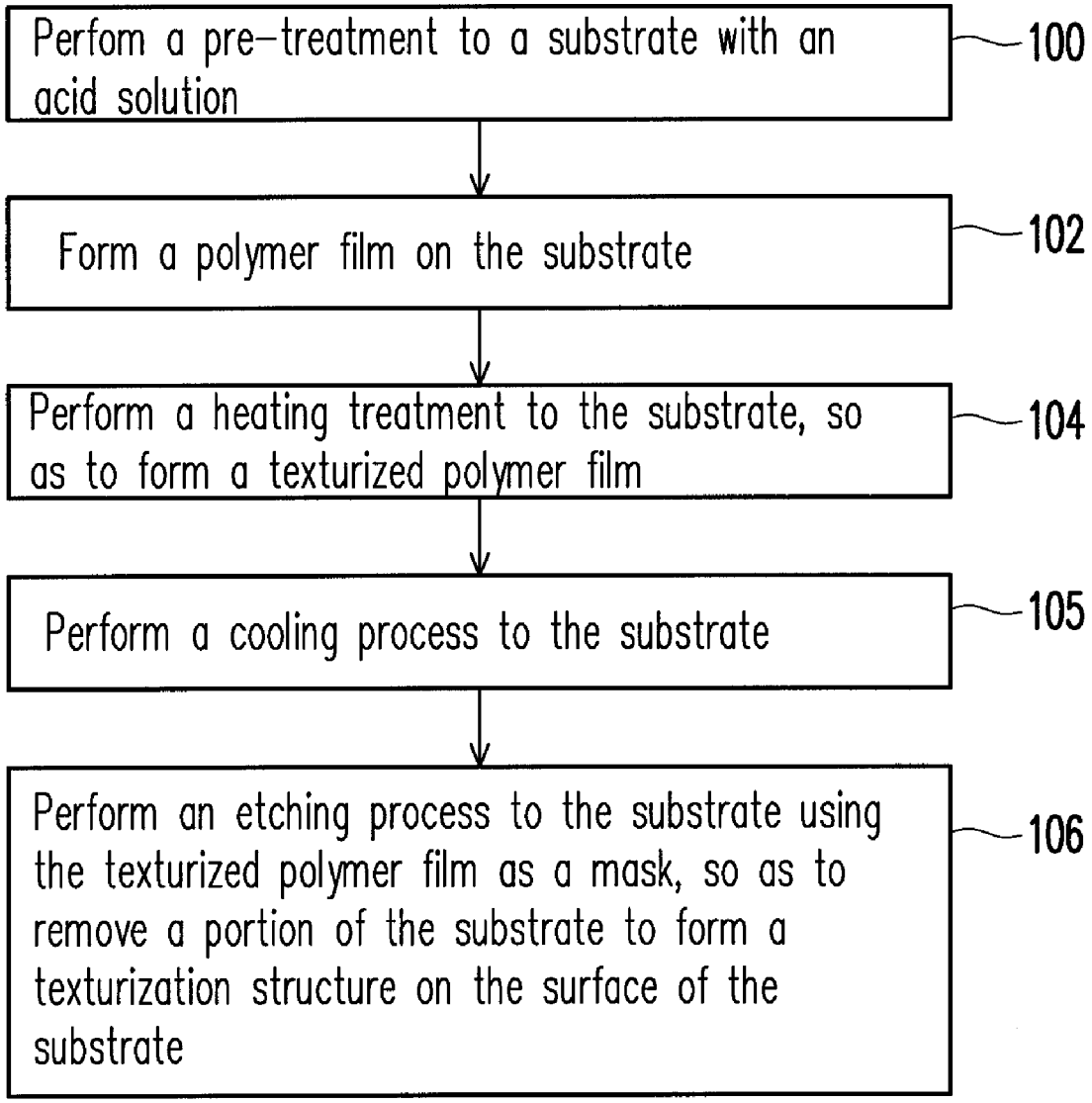
FIG. 1 illustrates a process flow of a surface texturization method according to an embodiment of the present invention.

FIG. 1 illustrates a process flow of a surface texturization method according to an embodiment of the present invention.

Referring to FIG. 1, in a step 102, a polymer film is formed on a substrate. The substrate includes silicon, such as single crystal silicon, multi-crystalline silicon or etc. An isolation layer such as a silicon oxide layer can be formed on the substrate. The method of forming the polymer film on the substrate includes blade-coating, spray-coating or spin-coating a polymer solution on the substrate, for example. The method of forming the polymer solution is to disperse a polymer material in a solvent. The polymer material includes polyvinyl alcohol (PVA) or polyvinyl butyral (PVB) resin. The solvent includes water or α-Terpineol. For example, when the polymer material is PVA, the used solvent is water. When the polymer material is PVB resin, the used solvent is α-Terpineol.

Except the pure solvent, a mixture including a plurality of components can be used as the solvent for forming the polymer solution, and the polymer material has different solubility in these components. In an embodiment, when the polymer material is PVB resin, the used solvent can be a mixture of water and α-Terpineol in a certain ratio and water and α-Terpineol are immiscible with each other. In another embodiment, when the polymer material is acrylic resin, the used solvent can be a mixture of water, acetic ester and toluene in a certain ratio, and acrylic resin has different solubility in water, acetic ester and toluene. It is noted that the polymer material of the present invention does not include a copolymer used in the conventional method, so that placing the copolymer on the substrate for several hours for reaction is not required, and the fabrication time is greatly reduced.

In an embodiment, before the polymer film is formed on the substrate (step 102), a pre-treatment can be optionally performed to the substrate with an acid solution (step 100) for enhancing the adhesion of the polymer film to the substrate. In details, a saw damage removal (SDR) and a surface macro-texturization are performed to the substrate with the acid solution, so as to form an irregular surface on the substrate. The acid solution for forming the irregular surface on the substrate includes hydrofluoric acid (HF) and nitric acid ($HNO_3$), for example.

Referring to FIG. 1, in a step 104, a heating treatment is performed to the substrate, so as to form a textured polymer film. In the step 104, the polymer film on the substrate is shrunk spontaneously to form the textured polymer film having island-shaped or microcrack-shaped patterns. The patterns of the textured polymer film are varied by adjusting the thickness of the polymer film and the setting parameters of the heating treatment. For example, a thinner polymer film and a rapid increase in temperature can produce a textured polymer film having more microcrack-shaped patterns. On the other hand, a thicker polymer film and a slow increase in temperature can produce a textured polymer film having more island-shaped patterns. The present invention is not limited thereto. It is appreciated by persons skilled in the art that a textured polymer film having all microcrack-shaped or island-shaped patterns can be fabricated upon the process requirement. Further, the heating treatment can be performed in an in-line infrared (IR) furnace; that is, the heating treatment is suitable for the continuous production line, the process integration is easy and a bottleneck is not observed in the process flow. The present invention is not limited thereto. It is appreciated by persons skilled in the art that the heating treatment can be a rapid thermal process (RTP) in an off-line batch-type furnace. Thereafter, a cooling process can be optionally performed to the substrate (step 105).

Referring to FIG. 1, in a step 106, an etching process is performed to the substrate, so as to remove a portion of the substrate to form a textured structure on the surface of the substrate. The textured structure is a nano-scale textured structure. The etching process includes a wet etching process such as a chemical solution etching or a dry etching process such as a plasma etching. In the step 106, as the textured structure is gradually formed on the surface of the substrate, the substrate below the textured polymer film is gradually removed, and finally the textured polymer film is lifted off and removed simultaneously by the same etching process. The surface texturization method is thus completed.

In summary, the surface texturization method of the present invention only requires a simple coating process, a heating treatment and an etching process to complete a nano-scale surface textured structure. The conventional expensive vacuum sputtering, the complicated electroless plating process or the time-consuming copolymerization reaction is not required. That is, the method in accordance with the present invention is very competitive due to the flexible process and low fabrication cost thereof.

Several examples are numerated in the following to further illustrate the surface texturization method of the present invention.

FIRST EXAMPLE

Figure 2:
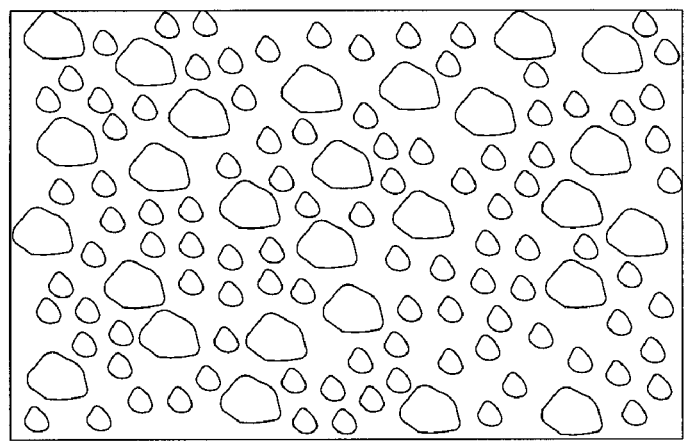
FIG. 2 schematically illustrates a textured polymer film according to a first example of the present invention.

FIG. 2 schematically illustrates a textured polymer film according to a first example of the present invention.

First, a polymer solution was prepared. The polymer solution was a 10 wt % PVA solution. Thereafter, the polymer solution was spin-coated uniformly on the multi-crystalline silicon substrate at 800 rpm for 15 seconds. Before the polymer solution was coated on the substrate, the substrate was etched by a mixed acid solution of HF, $HNO_3$ and $H_2O$ in a certain ratio of 2.5:1:2.5 at 10° C. for 3 minutes, so as to remove the saw damage layer of the substrate and enhance the adhesion of the polymer film to the substrate.

After the PVA film was formed on the substrate, a heating treatment was performed to the substrate in an in-line IR furnace, so that the PVA film on the substrate was shrunk spontaneously to a textured polymer film having island-shaped or microcrack-shaped patterns as shown in FIG. 2. The moving speed of the conveyor in the in-line IR furnace was 50 ipm (inch per minute), for example. The temperature setting of a plurality of IR furnaces in serial connection was 600° C./420° C./410° C./445° C./500° C./500° C., for example.

Thereafter, an etching process was performed to the substrate using the textured PVA film as a mask. The substrate was dipped in a mixture of HF, $HNO_3$ and $H_2O$ in a ratio of 3:1:2.5 at 25° C. for 30 seconds, so as to remove a portion of the substrate to form a textured structure on the surface of the substrate.

Figure 3:
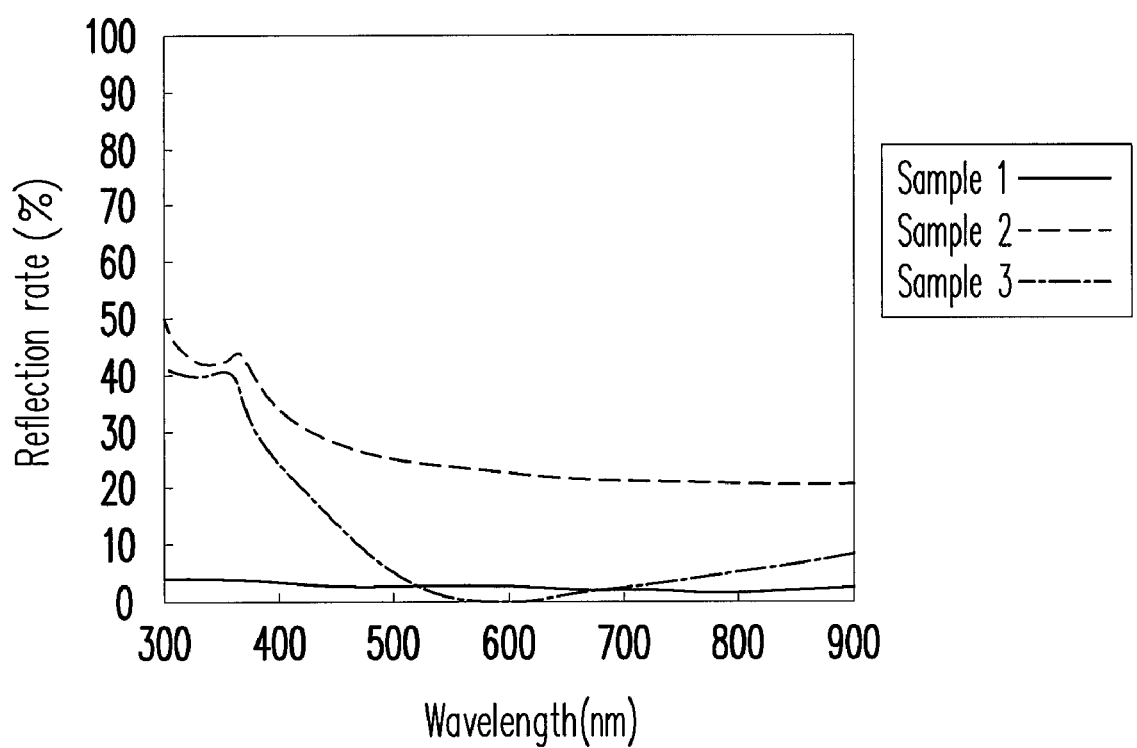
FIG. 3 illustrates a diagram of reflection as a function of wavelength, in which a conventional textured silicon substrate is compared with the textured silicon substrate fabricated based on the surface texturization method according to the first example of the present invention.

FIG. 3 illustrates a diagram of reflection as a function of wavelength, in which a conventional textured silicon substrate is compared with the textured silicon substrate fabricated based on the surface texturization method according to the first example of the present invention. Sample 1 is the textured silicon substrate fabricated based on the surface texturization method according to the first example of the present invention. Sample 2 is the textured silicon substrate fabricated by a conventional wet etching process. Sample 3 is the textured silicon substrate fabricated by a conventional wet etching process and a subsequent deposition of an anti-reflection coating. Referring to FIG. 3, the average reflectivity of Sample 1 is below 5% in a wide wavelength range from 300 nm to 900 nm, i.e. the spectra region of strong Si absorption. The average reflectivity of Sample 2 is up to 50%, and even after the anti-reflection coating is deposited (Sample 3), the reflectivity of Sample 3 is still high in the lower wavelength range from 300 nm to 500 nm and in the higher wavelength range from 700 nm to 900 nm. Therefore, the textured silicon substrate fabricated based on the surface texturization method of the present invention can reduce the reflection losses and improve the light-trapping properties, so as to enhance the efficiency of the solar cell.

SECOND EXAMPLE

Figure 4:
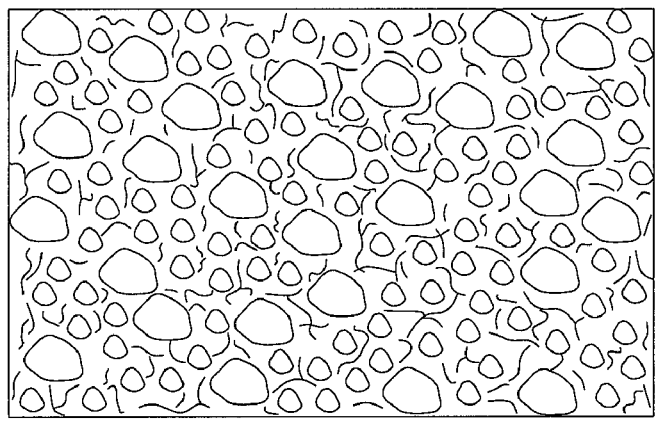
FIG. 4 schematically illustrates a textured polymer film according to a second example of the present invention.

FIG. 4 schematically illustrates a textured polymer film according to a second example of the present invention.

First, a polymer solution was prepared. A 10 wt % PVB solution was fabricated by resolving PVB resin in α-Terpineol and then forming an immiscible system of the 10 wt % PVB solution and water in a ratio of 3:1. Thereafter, the polymer solution was stirred for micro-phase separation. Afterwards, the polymer solution was spin-coated uniformly on the multi-crystalline silicon substrate at 800 rpm for 15 seconds. Before the polymer solution was coated on the substrate, the substrate was etched by a mixed acid solution of HF, $HNO_3$ and $H_2O$ in a ratio of 2.5:1:2.5 at 10° C. for 3 minutes, so as to remove the saw damage layer of the substrate and enhance the adhesion of the polymer film to the substrate.

After the PVB film was formed on the substrate, a heating treatment was performed to the substrate in an in-line IR furnace, so that the PVB film on the substrate was shrunk spontaneously to a textured polymer film having island-shaped and microcrack-shaped patterns as shown in FIG. 4. The solvent of the polymer solution was a mixture including two solvents immiscible with each other, and the polymer had different solubility in these solvents, so that the thickness distribution of the textured PVB film of the second example (as shown in FIG. 4) was not as uniform as the thickness distribution of the textured PVA film of the first example (as shown in FIG. 2). The intended non-uniform film thickness distribution also resulted in a nano-scale textured polymer film after the subsequent heating treatment. Such method was beneficial to further reduce the usage amount of the polymer material. The microcrack-shaped patterns were easy to form on the area with thinner PVB polymer film after the heating treatment. Further, the moving speed of the conveyor in the in-line IR furnace was 50 ipm (inch per minute), for example. The temperature setting of a plurality of IR furnaces in serial connection was 600° C./420° C./410° C./445° C./500° C./500° C., for example.

Thereafter, an etching process was performed to the substrate using the textured PVB film as a mask. The substrate was dipped in a mixture of HF, $HNO_3$ and $H_2O$ in a ratio of 3:1:2.5 at 25° C. for 30 seconds, so as to remove a portion of the substrate to form a textured structure on the surface of the substrate.

Figure 5:
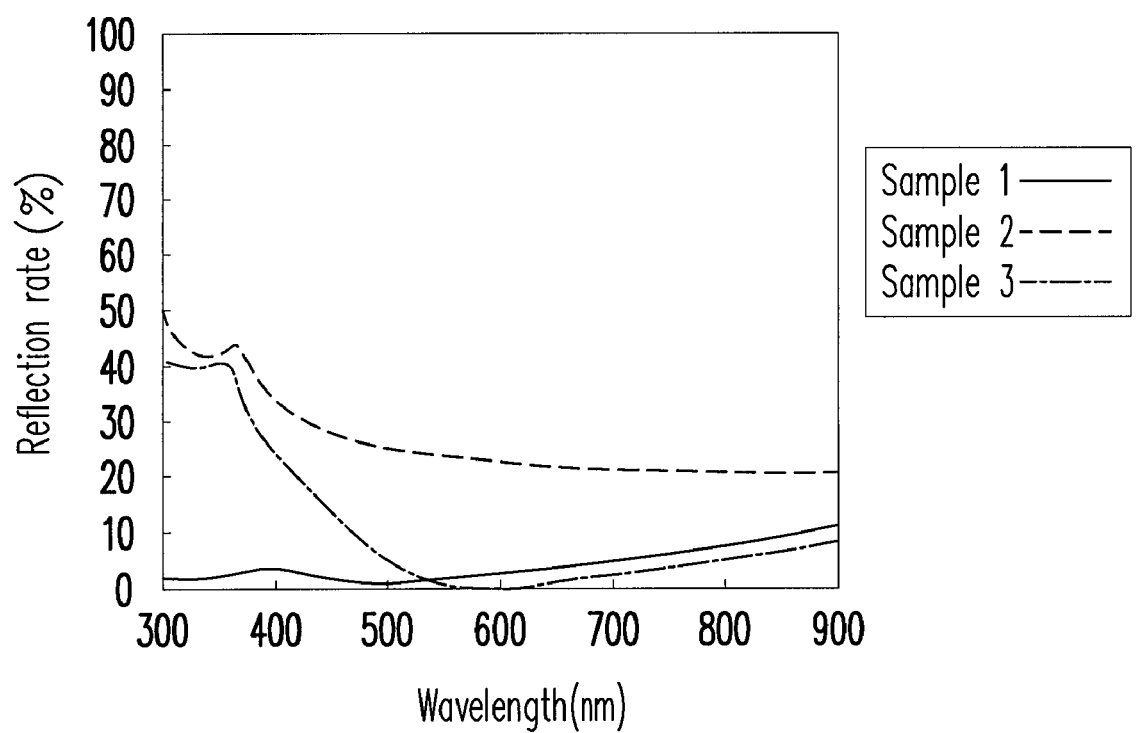
FIG. 5 illustrates a diagram of reflection as a function of wavelength, in which a conventional textured silicon substrate is compared with the textured silicon substrate fabricated based on the surface texturization method according to the second example of the present invention.

FIG. 5 illustrates a diagram of reflection as a function of wavelength, in which a conventional textured silicon substrate is compared with the textured silicon substrate fabricated based on the surface texturization method according to the second example of the present invention. Sample 1 is the textured silicon substrate fabricated based on the surface texturization method according to the second example of the present invention. Sample 2 is the textured silicon substrate fabricated by a conventional wet etching process. Sample 3 is the textured silicon substrate fabricated by a conventional wet etching process and a subsequent deposition of an anti-reflection coating. Referring to FIG. 5, the average reflectivity of Sample 1 is below 10% in a wide wavelength range from 300 nm to 900 nm, i.e. the spectra region of strong Si absorption. The average reflectivity of Sample 2 is up to 50%, and even after the anti-reflection coating is deposited (Sample 3), the reflectivity of Sample 3 is still high in the lower wavelength range from 300 nm to 500 nm. Therefore, the textured silicon substrate fabricated based on the surface texturization method of the present invention can reduce the reflection losses and improve the light-trapping properties, so as to enhance the efficiency of the solar cell.

In summary, the surface texturization method of the present invention has the advantages as follows:

1. The expensive vacuum sputtering or electroless plating process is not required, so that the fabrication cost is greatly saved.

2. The time-consuming copolymerization reaction is not required. The whole process flow including a coating process, a heating treatment and an etching process can be completed in a short time. The method in accordance with the present invention is suitable for mass production due to the simple process and easy operation thereof.

3. The method of the present invention can be completed in the in-line equipment. That is, the method of the present invention is suitable for the continuous production line, the process integration is easy and the fabrication process is quick and low-cost.

4. The patterns of the textured polymer film are varied by adjusting the thickness or thickness distribution of the polymer film and the setting parameters of the heating treatment. That is, the method in accordance with the present invention can be applied widely.

5. After the textured polymer film is formed, a nano-scale textured structure with low reflectivity can be formed on the substrate by an appropriate etching process. The etching process is flexible and can be a wet chemical solution etching or a dry plasma etching with process.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A surface texturization method, comprising:
    forming a polymer film on a substrate;
    performing a heating treatment to the substrate, so as to form a textured polymer film; and
    performing an etching process using the textured polymer film as a mask, so as to remove a portion of the substrate to form a textured structure on a surface of the substrate,
    wherein the step of forming the polymer film on the substrate comprises coating a polymer solution on the substrate, a method of forming the polymer solution comprises dispersing a polymer material in a solvent, and the polymer material does not comprise a copolymer.

2. The surface texturization method of claim 1, wherein a method of coating the polymer solution on the substrate comprises blade-coating, spray-coating or spin-coating.

3. The surface texturization method of claim 1, wherein the polymer material comprises polyvinyl alcohol (PVA) or polyvinyl butyral (PVB) resin.

4. The surface texturization method of claim 1, wherein the solvent comprises water or α-Terpineol.

5. The surface texturization method of claim 1, wherein the solvent comprises a first solvent and a second solvent, the first solvent and the second solvent are immiscible with each other and the polymer material has different solubility in the first solvent and the second solvent.

6. The surface texturization method of claim 5, wherein when the polymer material is PVB resin, the first solvent is α-Terpineol and the second solvent is water.

7. The surface texturization method of claim 1, wherein the solvent comprises a first solvent, a second solvent and a third solvent, the polymer material has different solubility in the first solvent, the second solvent and the third solvent.

8. The surface texturization method of claim 7, wherein when the polymer material is acrylic resin, the first solvent is water, the second solvent is acetic ester and the third solvent is toluene.

9. The surface texturization method of claim 1, wherein the solvent is a mixture comprising a plurality of components, and the polymer material has different solubility in the components.

10. The surface texturization method of claim 1, wherein the substrate comprises silicon.

11. The surface texturization method of claim 1, wherein the polymer film is shrunk spontaneously to the polymer film having island-shaped or microcrack-shaped patterns during the step of performing the heating treatment to the substrate.

12. The surface texturization method of claim 1, wherein the textured structure is a nano-scale textured structure.

13. The surface texturization method of claim 1, further comprising performing a saw damage removal and a surface macro-texturization with an acid solution.

14. The surface texturization method of claim 1, wherein the heating treatment is performed in an in-line infrared furnace or an off-line batch-type furnace.

15. The surface texturization method of claim 1, wherein the etching process comprises a dry etching process or a wet etching process.

16. The surface texturization method of claim 1, further comprising performing a cooling process to the substrate after the step of performing the heating treatment to the substrate and before the step of performing an etching process to the substrate.

* * * * *